United States Patent [19]

Green et al.

[11] 4,339,567

[45] Jul. 13, 1982

[54] PHOTOPOLYMERIZATION BY MEANS OF SULPHOXONIUM SALTS

[75] Inventors: George E. Green, Stapleford; Edward Irving, Burwell, both of England

[73] Assignee: Ciba-Geigy Corporation, Ardsley, N.Y.

[21] Appl. No.: 237,184

[22] Filed: Feb. 23, 1981

[30] Foreign Application Priority Data

Mar. 7, 1980 [GB] United Kingdom ............... 8007893
Jul. 19, 1980 [GB] United Kingdom ............... 8023690
Dec. 13, 1980 [GB] United Kingdom ............... 8040003

[51] Int. Cl.³ ..................... C08F 2/50; B32B 27/16; C08G 65/10
[52] U.S. Cl. ..................... 528/102; 204/159.11; 204/159.14; 204/159.12; 204/159.18; 204/159.24; 428/415; 428/418; 525/118; 525/482; 525/918; 526/192; 526/193; 526/195; 526/208; 526/220; 526/222; 526/273; 526/266; 526/332; 526/333; 528/89; 528/90; 528/138; 528/141; 528/143; 528/236; 528/240; 528/242; 528/264; 528/271; 528/408; 528/409; 528/417
[58] Field of Search ..................... 568/27; 430/280; 204/159.11, 159.12, 159.14, 159.18, 159.24; 526/192, 193, 195, 208, 220, 222, 266, 273, 332, 333; 528/89, 90, 138, 141, 143, 236, 240, 242, 408, 409, 417

[56] References Cited

U.S. PATENT DOCUMENTS

| | | |
|---|---|---|
| 3,196,184 | 7/1965 | Berry . |
| 3,442,901 | 5/1969 | Koenig et al. . |
| 3,708,296 | 1/1973 | Schlesinger . |
| 3,989,644 | 11/1976 | Bolon et al. . |
| 4,032,673 | 6/1977 | Schroeder et al. . |
| 4,058,400 | 11/1977 | Crivello . |
| 4,058,401 | 11/1977 | Crivello . |
| 4,069,054 | 1/1978 | Smith . |
| 4,081,276 | 3/1978 | Crivello . |
| 4,085,019 | 4/1978 | Green . |
| 4,090,936 | 5/1978 | Barton . |
| 4,101,513 | 7/1978 | Woodbury et al. . |
| 4,102,687 | 7/1978 | Crivello . |
| 4,105,806 | 8/1978 | Watt . |
| 4,108,747 | 8/1978 | Crivello . |
| 4,113,895 | 9/1978 | Watt et al. . |
| 4,136,102 | 1/1979 | Crivello . |
| 4,138,255 | 2/1979 | Crivello . |
| 4,139,385 | 2/1979 | Crivello . |
| 4,154,872 | 5/1979 | Tsao et al. . |
| 4,156,035 | 5/1979 | Tsao et al. . |
| 4,156,046 | 5/1979 | Lien et al. . |
| 4,161,405 | 7/1979 | Crivello . |
| 4,161,478 | 7/1979 | Crivello . |
| 4,173,476 | 11/1979 | Smith et al. . |
| 4,186,108 | 1/1980 | Carlson et al. . |
| 4,193,799 | 3/1980 | Crivello . |
| 4,197,174 | 4/1980 | Chang . |
| 4,201,640 | 5/1980 | Watt . |
| 4,216,288 | 8/1980 | Crivello . |
| 4,218,531 | 8/1980 | Carlson . |
| 4,230,814 | 10/1980 | Crivello . |
| 4,231,886 | 11/1980 | Carlson . |
| 4,233,421 | 11/1980 | Worm . |
| 4,299,938 | 11/1981 | Green et al. ............... 204/159.11 |

FOREIGN PATENT DOCUMENTS 2833648 2/1979 Fed. Rep. of Germany .
1526923 10/1978 United Kingdom .
1565671 4/1980 United Kingdom .

OTHER PUBLICATIONS

M. Kobayashi et al. Bull. Chem. Soc. Japan 1973, 46 2255-2256.
K. Kamiyama et al. Bull. Chem. Soc. Japan, 1973, 46 2255-2256.
M. Takebayashi et al. Chemistry Letters, 1973, 809-812.
S. Oae et al., Int. J. Sulfur Chem. Part A. 1972, 2-49-61.
C. R. Johnson et al. J. Amer. Chem. Soc. 1973, 95 7692-7700.
K. Ryoke et al., Bull. Chem. Soc. Japan, 1976, 49, 1455-1456.

*Primary Examiner*—John C. Bleutge
*Assistant Examiner*—Arthur H. Koeckert
*Attorney, Agent, or Firm*—Harry Falber

[57] ABSTRACT

Substances (I) capable of being converted into higher-molecular weight materials under the influence of a cationic catalyst, such as 1,2-epoxides, aminoplasts, vinyl monomers or prepolymers, or phenoplasts, are so converted by exposure to actinic radiation in the presence of a sulphoxonium salt (II) of formula

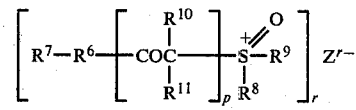

where
P denotes zero or 1,
$R^6$ denotes an arylene or aralkylene group,
$R^7$ denotes —H or a group of formula

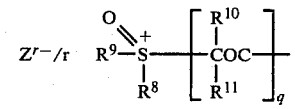

$R^8$ denotes an alkyl, alkenyl, cycloalkyl, cycloalkylalkyl, aryl, or aralkyl group,
$R^9$ has the same meaning as $R^8$ but may alternatively represent a dialkylamino group or, if $R^8$ represents an alkyl group, $R^9$ may represent an arylamino group,
$R^{10}$ and $R^{11}$ each independently have the same meaning as $R^8$ but may also each denote —H,
r represents 1, 2, or 3,
$Z^{r-}$ denotes an r-valent anion of a protic acid, and q denotes zero when p denotes zero, or zero or 1 when p denotes 1.

Typical II are dimethylphenylsulphoxonium hexafluorophosphate and perchlorate, dimethylphenacylsulphoxonium hexafluorophosphate, and chloride, dodecylmethylbenzylsulphoxonium hexafluorophosphate, and 1,4-bis(1-oxo-2-(dimethylsulphoxonium)ethyl)benzene dihexafluoroarsenate.

When I is a polyepoxide or a resol, it may be photopolymerized by means of II and subsequently crosslinked by heating with a latent heat-curing agent.

10 Claims, No Drawings

PHOTOPOLYMERIZATION BY MEANS OF SULPHOXONIUM SALTS

This invention relates to compositions comprising a cationically-polymerisable material and a sulphoxonium salt. It also relates to the polymerisation of such compositions by means of actinic radiation, to the optional further crosslinking of polymerised products so obtained by means of heat in the presence of heat-curing agents, and to the use of the compositions as surface coatings, in printing plates, in printed circuits, and in reinforced composites, and as adhesives.

For a number of reasons, it has become desirable to induce polymerisation of organic materials by means of actinic radiation. Employing photopolymerisation procedures may, for example, avoid the use of organic solvents with their attendant risks of toxicity, flammability, and pollution, and the cost of recovering the solvent. Photopolymerisation enables insolubilisation of the resin composition to be restricted to defined areas, i.e., those which have been irradiated, and so permits the production of printed circuits and printing plates or allows the bonding of substrates to be confined to required zones. Further, in production processes, irradiation procedures are often more rapid than those involving heating and a consequential cooling step.

It has been known for some years that certain aromatic diazonium salts undergo decomposition on exposure to actinic radiation and that, if the salt is mixed with a cationically-polymerisable substance, then the Lewis Acid which is generated in situ on irradiation induces polymerisation (see, for example, British Pat. No. 1,321,263). Although the use of actinic irradiation overcomes disadvantages associated with the employment of heat in polymerisation processes, the diazonium salts are not entirely satisfactory: the pot-life of the mixture of diazonium salt and cationically-polymerisable substance is often too short, particularly in daylight, and secondly, nitrogen is generated during liberation of the Lewis Acid catalyst, which evolution of gas restricts the range of processes in which the catalysts may successfully be employed.

Numerous proposals have therefore been made for the replacement of these diazonium salts by others which, while liberating an acid catalyst on irradiation, do not also evolve nitrogen: particularly intensively studied have been onium salts of sulphur, and iodonium salts.

Thus, it has recently been disclosed, in British Pat. No. 1,516,511 and its United States equivalent, No. 4,058,401, that a mono-1,2-epoxide, an epoxide resin (i.e., a substance containing on average more than one 1,2-epoxide group), or a mixture thereof, may be polymerised or cured by means of a radiation-sensitive aromatic onium salt of oxygen, sulphur, selenium, or tellurium present in an amount capable of effecting the polymerisation or cure of the epoxide (or polyepoxide) by release of a Bronsted Acid catalyst when exposed to radiant energy. The only such salts described in the Specification are of the formula

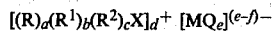  I where
R denotes a monovalent aromatic radical,
$R^1$ denotes an alkyl, cycloalkyl, or substituted alkyl group,
$R^2$ denotes a polyvalent aliphatic or aromatic radical forming a heterocyclic or fused ring structure,
X denotes oxygen, sulphur, selenium, or tellurium,
M denotes an atom of a metal or metalloid, such as antimony, iron, tin, bismuth, aluminum, gallium, indium, titanium, zirconium, scandium, vanadium, chromium, manganese, boron, phosphorus, or arsenic,
Q denotes a halogen radical,
a denotes 0, 1, 2, or 3,
b denotes 0, 1, or 2,
c denotes 0 or 1, the sum of a+b+c being 3 or the valency of X,
d denotes (e-f),
f is the valency of M, and is an integer of from 2 to 7, and
e is more than f and is an integer of up to 8.

Shortly afterwards, in British Pat. No. 1,518,141, and also in its corresponding U.S. Pat. No. 4,058,400, the same patentee disclosed that monomeric or prepolymeric, cationically polymerisable organic materials free from any 1,2-epoxide group, selected from vinyl monomers, vinyl prepolymers, cyclic ethers, cyclic esters, cyclic sulphides, cyclic amines, and organosilicon cyclics, can also be polymerised by exposing them to radiant energy in the presence of an effective amount of a radiation-sensitive onium salt of the Group VIA elements listed above. The only onium salts described are likewise of formula 1 above.

Still more recently, in its U.S. Pat. No. 4,102,687, the same patentee disclosed that the curing of urea-formaldehyde resins, melamine-formaldehyde resins, and phenol-formaldehyde resins could be initiated by exposing them to ultraviolet radiation in the presence of a Group VIA onium salt, curing being completed by heating. Again, only the onium salts of formula I are mentioned.

Subsequent disclosures of this patentee concerning onium salts of sulphur have been confined to sulphonium salts.

Thus, British Pat. No. 1,535,492 describes the use of radiation-sensitive sulphonium salts of arylsulphonic, haloarylsulphonic, alkylsulphonic, and haloalkylsulphonic acids for the cationic polymerisation of epoxide resins, vinyl monomers and prepolymers, cyclic organic ethers, cyclic organic esters, cyclic organic sulphides, cyclic amines, and cyclic organic silicon compounds.

Its U.S. Pat. No. 4,139,385 discloses the use of sulphonium and other salts in the curing of polyolefins by means of polythiols. A polyethylenically unsaturated compound, such as diallyl phthalate, diallyl maleate, or triallyl cyanurate, is mixed with a polythiol, such as trimethylolpropane trithioglycollate or pentaerythritol tetra(3-mercaptopropionate) and, e.g., triphenylsulphonium hexafluoroarsenate or triphenylsulphonium tetrafluoroborate, and then exposed to ultraviolet light. The salts used as catalysts are all of the formula

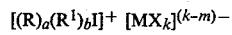  II or

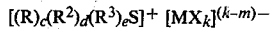  III or

  IV where
R denotes a monovalent aromatic radical,
$R^1$ denotes a divalent aromatic radical,
$R^2$ denotes a polyvalent aliphatic or aromatic radical forming a heterocyclic or fused ring structure,
$R^4$ denotes an alkyl, alkoxy, cycloalkyl, or substituted alkyl radical,
$R^5$ denotes a polyvalent radical forming an aromatic, heterocyclic or fused ring structure,
M denotes an atom of a metal or a metalloid,
X denotes a halogen radical,
Z denotes a nitrogen, phosphorus, arsenic, bismuth, or antimony atom,
a denotes 0 or 2,
b denotes 0 or 1, where $a+b=2$ or the valency of iodine,
c denotes 0 or 3,
d denotes 0 or 2,
e denotes 0 or 1, such that $(c+d+e)=3$ or the valency of sulphur,
f is an integer of from 0 to 4,
g is 0, 1, or 2,
h is 0, 1, or 2, such that $(f+g+h)=4$ or the valency of Z,
j is $k-m$,
m is the valency of M, being 2 to 7, and
k is an integer of more than 1 but not more than 8.

Its West German Offenlegungsschrift No. 2 833 648 discloses that triarylsulphonium salts of formula

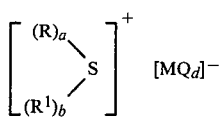

can be used to initiate the curing, on irradiation, of an aliphatically-unsaturated composition containing a 1,2-epoxide group, such as glycidyl acrylate, or a mixture of an epoxide resin with an aliphatically-unsaturated substance such as methyl methacrylate, a polyester, or styrene. In formula V—

R denotes an aromatic hydrocarbon or heterocyclic group of 6 to 13 carbon atoms, which may be substituted,
a is 1 or 3,
b is 0 or 1,
S has a valency of 3, which may be satisfied by R alone or by a combination of R and $R^1$,
M denotes an atom of a metal or metalloid,
Q denotes a halogen radical, and
d is 4, 5, or 6.

Its U.S. Pat. No. 4,136,102 describes various sulphonium salts containing a hexafluorophosphate, hexafluoroarsenate, or hexafluoroantimonate anion and their use in curing epoxide resins. They are stated to be also useful for the polymerisation of a variety of unspecified cyclic organic and cyclic organo-silicon compounds.

Its West German Offenlegungsschrift No. 2 730 725 discloses the photo-induced curing, by means of aromatic onium salts, of epoxide resin compositions which also contain a polyvinyl acetal. The only onium salts of sulphur indicated are those of formula I.

Its U.S. Pat. No. 4,081,276 describes a process for the formation of photoresist, images, especially for printed circuit production, wherein a layer of a photoinitiator is exposed to radiant energy and then contacted with a cationically polymerisable material, e.g., an epoxide resin. Again, the only onium salts of sulphur cited are those of formula I above.

Another patentee has described, in Belgian Pat. No. 845 746, the photopolymerisation, using as catalyst an aromtic sulphonium salt or an aromatic iodonium salt, of mixtures comprising a compound having an epoxide functionality of more than 1.5 epoxide group per molecule and a compound having hydroxy functionality of at least one.

This second patentee describes, in U.S. Pat. No. 4,090,936, photohardenable liquid compositions comprising (a) an organic compound having an average epoxide functionality in the range of about 1 to 1.3, (b) from about 3 to 50% by weight, calculated on the weight of (a), of an organic polymer which is compatible with (a) and has a glass transition temperature in the range of about −20° C. to 105° C., being a polymer derived from at least one acrylate or methacrylate monomer, or a copolymer of styrene and allyl alcohol, or a polyvinyl butyral polymer, and (c) an aromatic complex salt photoinitiator which is an onium salt of a Group VA or Group VLA element or a halonium salt. The only onium salts of sulphur indicated are sulphonium salts.

Another disclosure of this second patentee, U.S. Pat. No. 4,069,054, relates to photopolymerisable compositions containing a cationically polymerisable monomer, an aromatic sulphonium compound, and an aromatic tertiary amine, aromatic tertiary diamine, or an aromatic polycyclic compound as a sensitiser.

An aromatic sulphonium salt, namely triphenylsulphonium hexafluorophosphate, has been used commercially for the photopolymerisation of epoxide resins.

We have now surprisingly found that cationically polymerisable materials can be photpolymerised by means of certain aromatic sulphoxonium salts.

The sulphonium salts of the prior art are also said to be heat-curing or heat-polymerising catalysts. However, the sulphoxonium salts of the compositions of this invention have little or no effect on heating in the absence of actinic radiation with compounds capable of being transformed into a higher-molecular weight material under the influence of a cationic catalyst. Thus, a composition comprising 2 parts by weight of dimethylphenacylsulphoxonium hexafluorophosphate and 100 parts by weight of an epoxide resin (2,2-bis(4-glycidyloxyphenyl)propane) did not gel on heating at 150° C. for 48 hours. It follows that, protected from actinic radiation, compositions of the present invention have desirably long pot-lives.

Unlike compositions of the prior art containing sulphonium salts as catalysts, the compositions of this invention do not liberate obnoxiously-smelling mercaptans on irradiation.

We have further found that, contrary to what would be expected from the teachings of U.S. Pat. No. 4,102,687, ureaformaldehyde resins may be cured on irradiation in the presence of a sulphoxonium salt employed in the compositions of this invention without the need to apply heat.

This invention accordingly provides compositions comprising (a) a compound, or mixture of compounds, capable of being transformed into a higher-molecular weight material under the influence of a cationic catalyst, (b) an effective amount of a sulphoxonium salt of the formula

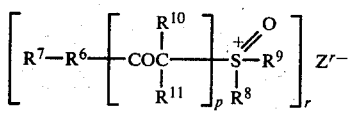 VI where
p denotes zero or 1,

R⁶ denotes an arylene or aralkylene group of 4 to 25 carbon atoms linked directly through a carbon atom thereof, if p denotes zero, to the indicated sulphur atom or, if p denotes 1, to the indicated carbonyl carbon atom, R⁷ denotes a hydrogen atom, or a group of formula

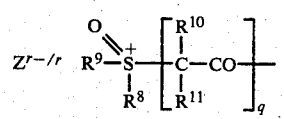 VII

R⁸ denotes an alkyl group of 1 to 18, preferably 1 to 12, carbon atoms, an alkenyl group of 2 to 6 carbon atoms, a cycloalkyl group of 3 to 4 carbon atoms, a cycloalkylalkyl group of 4 to 8 carbon atoms, an aryl group of 4 to 24 carbon atoms, or an aralkyl group of 5 to 16 carbon atoms, R⁹ has the same meaning as R⁸ but may alternatively represent a dialkylamino group of 2 to 6 carbon atoms or, if R⁸ denotes a said alkyl group, it may alternatively represent an arylamino group of 4 to 8 carbon atoms, R¹⁰ and R¹¹ each independently have the same meaning as R⁸ but may also each represent a hydrogen atom, r represents 1, 2, or 3, $Z^{r-}$ denotes an r-valent anion of a protic, preferably an inorganic, acid, and q denotes zero when p denotes zero, or zero or 1 when p denotes 1.

Another aspect of this invention provides a process for the transformation into higher-molecular weight material of a compound, or mixture of compounds, capable of being converted into a higher-molecular weight material under the influence of a cationic catalyst, comprising subjecting a said composition of this invention to actinic radiation.

In formula VI, R⁶ may denote a homocyclic or heterocyclic arylene or aralkylene group, R⁸ and R⁹ may denote a homocyclic or heterocyclic aryl or aralkyl group, and R⁹ may alternatively represent a homocyclic or heterocyclic arylamino group. By "heterocyclic aryl", "heterocyclic arylene", or "heterocyclic aralkylene" is meant an aromatic group in which at least one —CH₂— or —CH═ group of a ring of an aromatic compound is replaced by an atom other than carbon, usually nitrogen, oxygen, or sulphur. Examples of heterocyclic aryl groups are the 2-furyl radicals and 2-pyridyl radicals and examples of heterocyclic arylene groups are the furan-2,4-diyl and pyridine-2,6-diyl radicals.

Preferably R⁶ denotes a homocyclic group of 6 to 25 carbon atoms, for example, an anthrylene, phenanthrylene, or fluorenylene group, but preferably it represents a homocyclic arylene or aralkylene group of 6 to 11 carbon atoms, especially a phenylene or a naphthylene group or a phenylenemethylene group of formula

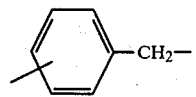 VIII or a xylylene group which may be substituted in the ring or rings by one or two alkyl groups, each of 1 to 4 carbon atoms, by one or two alkoxy groups, each of 1 to 4 carbon atoms, or by one or two chlorine, bromine, or fluorine atoms. R⁸ and R⁹ are preferably each an alkyl group of 1 to 4 carbon atoms, or a phenyl or naphthyl group which may be substituted in the ring or rings by one or two alkyl groups, each of 1 to 4 carbon atoms, by one or two alkoxy groups, each of 1 to 4 carbon atoms, or by one or two fluorine, chlorine, or bromine atoms.

R¹⁰ and R¹¹ preferably each represent a hydrogen atom.

$Z^{r-}$ may denote, for example, $CH_3SO_4^-$, $C_6H_5SO_3^-$, $p\text{-}CH_3C_6H_4SO_3^-$, $CF_3SO_3^-$, or $CF_3COO^-$; it preferably denotes $Cl^-$, $Br^-$, $NO_3^-$, $HSO_4^-$, $HSO_3^-$, $ClO_4^-$, $H_2PO_4^-$, $SO_4^{--}$, $PO_4^{---}$, or an anion of formula $$MX_n^- \qquad IX$$

where

M denotes an atom of a metal or of a metalloid, X denotes a halogen atom, preferably of fluorine or of chlorine, and n is 4, 5, or 6, and is one more than the valency of M, or of formula $$SbF_5(OH)^- \qquad X$$

M preferably denotes an atom of boron or bismuth, and more especially antimony, arsenic, or phosphorus. The anion or anions $MX_n^-$ may thus be, for example, hexachlorobismuthate or tetrafluoroborate but most preferably $PF_6^-$, $SbF_6^-$, or $AsF_6^-$.

Specific examples of suitable sulphoxonium salts are:
dimethylphenylsulphoxonium hexafluorophosphate,
dimethylphenylsulphoxonium perchlorate,
dimethylphenacylsulphoxonium hexafluorophosphate and the corresponding hexafluoroantimonate,
dimethylphenacylsulphoxonium chloride,
diphenylphenacylsulphoxonium hexafluorophosphate,
1,4-bis(1-oxo-2-(dimethylsulphoxonium)ethyl)benzene dihexafluoroarsenate and the corresponding dihexafluoroantimonate,
1,4-bis(1-oxo-2-(dimethylsulphoxonium)ethyl)benzene chloride,
(dimethylamino)diphenylsulphoxonium tetrafluoroborate,
(diethylamino)diphenylsulphoxonium hexafluorophosphate,
dodecylmethylbenzylsulphoxonium hexafluorophosphate,
triphenylsulphoxonium hexafluorophosphate, and
tris(dimethylphenacylsulphoxonium) phosphate.

The compositions of this invention preferably contain 0.1 to 7.5, and particularly 0.5 to 5.0, parts by weight of (b) per 100 parts by weight of (a).

Salts of formula VI which are further of the formula

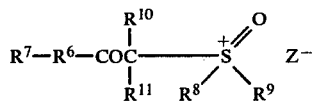 XI or

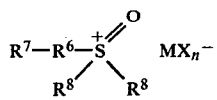 XII or

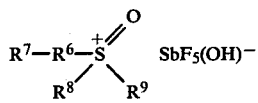 XIII where $R^6$ to $R^{11}$, $MX_n^-$, and $Z^-$ have the meanings previously assigned,
are believed to be new.

The sulphoxonium salts of formula VI may be prepared by several procedures.

1. Those where p and q are each zero, $R^6$ denotes an arylene group, $R^7$ denotes a hydrogen atom, $R^9$ denotes an alkyl, alkenyl, cycloalkyl, cycloalkylalkyl, or an aralkyl group as aforesaid, and $R^8$ has the meaning previously assigned, may be obtained by reaction of an aryl-containing sulphoxide of formula

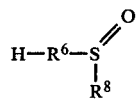 XIV with an iodide of formula $R^9I$, where $R^9$ denotes an alkyl, alkenyl, cycloalkyl, cycloalkylalkyl, or aralkyl group. Direct such S-alkylation of the aryl-containing sulphoxides has been found to be impracticable, and it is necessary to proceed via formation of the mercuritriiodide salt as described by M. Kobayashi et al., Bull. Chem. Soc. Japan, 1972, 45, 3703-6, and K. Kamiyama et al., ibid., 1973, 46, 2255-6. The mercuritriiodide may be converted into e.g., the hexafluorophosphate, either directly by double decomposition with silver hexafluorophosphate, or indirectly, by double decomposition with silver perchlorate followed by double decomposition of the sulphoxonium perchlorate with potassium hexafluorophosphate.

2. The bis-sulphonium salts where p and q are each zero, $R^7$ denotes a group of formula

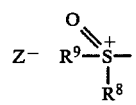 XV $R^9$ denotes an alkyl, alkenyl, cycloalkyl, cycloalkylalkyl, or an aralkyl group, $R^6$ denotes an arylene group, and $R^8$ has the meaning previously assigned, may be obtained in an analogous manner, from a bis-sulphoxide of formula

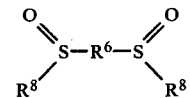 XVI

3. To prepare monosulphoxonium salts of formula VI where p denotes 1, q denotes zero, $R^6$ denotes an arylene group, and $R^7$ denotes a hydrogen atom, an aroyl chloride, $HR^6COCl$, such as benzoyl chloride or p-toluoyl chloride, can be reacted with a sulphoxonium ylide of formula

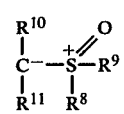 XVII followed, if at least one of $R^{10}$ and $R^{11}$ denotes a hydrogen atom, by neutralisation with a protic acid, HZ (see U.S. Pat. No. 3,442,901). An acid anhydride, $HR^6CO$—$O$—$COR^6H$, may also be used as the acylating agent. Thus, reaction of 2 mol. of dimethylsulphoxonium methylide (XVIII) with benzoyl chloride (XIX) yields dimethylsulphoxoniumphenacyl ylide (XX), neutralisation of which with hydrogen chloride gives dimethylphenacylsulphoxonium chloride (XXII, Z=Cl) while neutralisation with hexafluorophosphoric acid or tetrafluoroboric acid gives the corresponding hexafluorophosphate (XXII, Z=$PF_6$) or tetrafluoroborate (XXII, Z=$BF_4$). The hexafluorophosphate, and similar salts such as the hexafluoroarsenate (XXII, Z=$PF_6$ or $AsF_6$), or may alternatively be obtained by double decomposition with the chloride (XXII, Z=Cl).

If one of $R^{10}$ and $R^{11}$ denotes a hydrogen atom, as well as the ylide, a sulphoxonium salt is formed as co-product; thus, in formation of the ylide (XX), trimethylsulphoxonium chloride (XXI) is obtained as co-product. Where, as in the present example, this co-product contains no aryl group, it is not effective as a photopolymerising agent. However, in general, it does not interfere, but, if desired, it may be separated from the desired aracylsulphoxonium salt, e.g., by extraction of the latter into acetone.

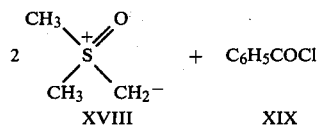

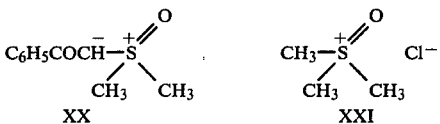

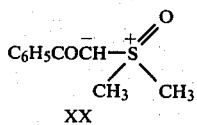
XX

HZ

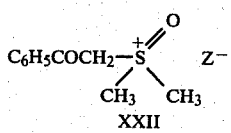
XXII

Reaction of 2 mol. of dimethylsulphoxonium methylide (XVIII) with benzoic anhydride yields a mixture of dimethylsulphoxonium phenacyl ylide (XX) and trimethylsulphoxonium benzoate: the ylide may be separated from the benzoate and converted similarly into the chloride by neutralisation with hydrogen chloride.

4. To prepare bis-sulphoxonium salts of formula VI where p denotes 1, q denotes zero or 1, $R^6$ denotes an arylene group, and $R^7$ denotes a group of formula VII, these may be obtained in an analogous manner from the sulphoxonium ylide of formula XVII and an aroylene dichloride of formula $ClCOR^6COCl$.

5. Alternatively, to prepare a monosulphoxonium salt or bis-sulphoxonium salt of formula VI where p denotes 1, q denotes zero or 1, and $R^6$ denotes an arylene group, $R^{10}$ and $R^{11}$ each denoting a hydrogen atom, an α-diazoacetophenone of formula

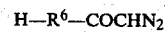
XXIII or a bis(α-diazo) compound of formula $N_2CHCO\text{-}R^6\text{-}COCHN_2$ XXIV is reacted with, as appropriate, 1 or 2 mol. of a sulphoxide of formula $R^8R^9SO$ in the presence of copper acetylacetonate, as described by M. Takebayashi et al., (*Chemistry Letters*, 1973, 809–12) to form an ylide of formula

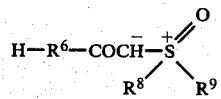
XXV or a bis-ylide of formula

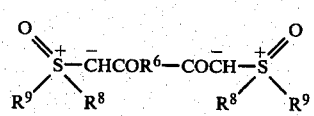
XXVI which is treated with a protic acid, HZ.

6. To prepare compounds of formula VI where p and q denote zero, $R^6$ denotes an arylene group, and $R^9$ denotes a dialkylamino group, an aryl sulphoxide of formula XIV is treated with hydrazoic acid to form the S-arylsulphoximine of formula

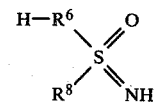
XXVII according to the method described by S. Oae et al., *Int. J. Sulfur Chem. Part A*, 1972, 2, 49–61, which is converted directly into the dialkylaminosulphoxonium salt by reaction with a trialkyloxonium salt such as triethyloxonium hexafluorophosphate or trimethyloxonium tetrafluorborate, following the procedure described by C. R. Johnson et al., *J. Amer. Chem. Soc.*, 1973, 95, 7692–7700.

7. To prepare compounds of formula VI where p denotes zero, $R^6$ denotes an arylene group, $R^8$ denotes an alkyl group, and $R^9$ denotes an arylamino group, an arylsulphoxide of formula XIV is reacted with the appropriate arenesulphonyl azide, e.g., reaction of the arylsulphoxide with toluene-p-sulphonyl azide affords the N-p-tolyl-S-arylsulphoximine (S. Oae et al., loc. cit.) which is then reacted as above with a trialkyloxonium salt to give the N-p-tolyl-N-alkylsulphoxonium salt.

8. Those where p and q are each zero, $R^6$ denotes an aralkylene group, $R^7$ denotes a hydrogen atom, $R^8$ has the meaning previously assigned, and $R^9$ denotes a methyl group may be obtained by reaction of an aralkyl-containing sulphoxide of formula XIV such as dodecyl benzyl sulphoxide or hexadecyl benzyl sulphoxide with dimethyl sulphate to give the methosulphate of formula

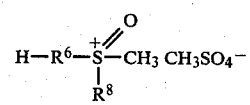
XXVIII as described in U.S. Pat. No. 3,196,184.

The methosulphate anion may then be replaced if desired by another anion using conventional means of anion exchange.

9. Salts of formula VI where p denotes zero, $R^7$ denotes a hydrogen atom, $R^6$ denotes an arylene group, and $R^8$ and $R^9$ both denote an aryl group may be obtained by oxidation of the corresponding triarylsulphonium salt with, e.g., m-chloroperbenzoic acid.

Where a particular protic acid, $H_rZ$, is not available or is difficult to handle, salts such as hexafluorophosphates and hexafluoroantimonates may be made by double decomposition of the corresponding chlorides or other suitable salts. For example, diphenylphenacylsulphoxonium hexafluorophosphate may be obtained by precipitation on adding an aqueous solution of potassium hexafluorophosphate to an aqueous solution of the chloride. The hexafluoroantimonates may be made by addition of solid sodium or potassium hexafluoroantimonate to an aqueous solution of the sulphoxonium chloride: if the sodium or potassium hexafluoroantimonate is first dissolved in water, then, due to hydrolysis, the product isolated is the hydroxopentafluoroantimonate $(MX_n^- = SbF_5(OH)^-)$.

Component (a) may be, for example, an oxetane, a thi-irane, or a tetrahydrofuran. Preferably it is a 1,2-epoxide, a vinyl monomer or prepolymer, an aminoplast, or a phenoplast.

When it is a 1,2-epoxide, $Z^-$ in formula VI (and, if present, in formula VII) must represent a group $MX_n^-$ as aforesaid or SbF$_5$(OH)$^-$. Component (a) may be, for example, a mono-1,2-epoxide, such as epichlorohydrin, propylene oxide, or a glycidyl ether of a monohydric alcohol or phenol, such as n-butyl glycidyl ether or phenyl glycidyl ether; it also may be, e.g., a glycidyl ester such as glycidyl acrylate or glycidyl methacrylate. Preferably it is an epoxide resin, especially a resin containing at least one group of formula

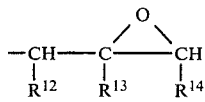 XXIX directly attached to an atom of oxygen, where either R$^{12}$ and R$^{14}$ each represents a hydrogen atom, in which case R$^{13}$ denotes a hydrogen atom or a methyl group, or R$^{12}$ and R$^{14}$ together represent —CH$_2$CH$_2$—, in which case R$^{13}$ denotes a hydrogen atom.

As examples of such resins may be mentioned polyglycidyl and poly(β-methylglycidyl) esters obtainable by reaction of a compound containing two or more carboxylic acid groups per molecule with epichlorohydrin, glycerol dichlorohydrin, or β-methylepichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised or trimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid; and from aromatic polycarboxylic acids such as phthalic acid, isophthalic acid, and terephthalic acid. Other suitable polyglycidyl esters are obtainable by polymerisation of glycidyl esters of vinylic acids, especially glycidyl acrylate and glycidyl methacrylate.

Further examples are polyglycidyl and poly(β-methylglycidyl) ethers obtainable by reaction of a compound containing at least two free alcoholic hydroxyl and/or phenolic hydroxyl groups per molecule with the appropriate epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,3-diol, poly(oxytetramethylene) glycols, pentane-1,5-diol, hexane-2,4,6-triol, glycerol, 1,1,1-trimethylolpropane, pentaerythritol, sorbitol, and poly(epichlorohydrin); from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane (otherwise known as bisphenol F), 4,4'-dihydroxydiphenyl, bis(4-hydroxyphenyl) sulphone, 1,1,2,2-tetrakis(4-hydroxyphenyl)ethane, 2,2-bis(4-hydroxyphenyl)propane, (otherwise known as bisphenol A), 2,2-bis(3,5-dibromo-4-hydroxyphenyl)propane, and novolaks formed from aldehydes such as formaldehyde, acetaldehyde, chloral, and furfuraldehyde, with phenol itself, and phenol substituted in the ring by chlorine atoms or by alkyl groups each containing up to nine carbon atoms, such as 4-chlorophenol, 2-methylphenol, and 4-tert.butylphenol.

Poly(N-glycidyl) compounds may also be used, e.g., N-glycidyl derivatives of amines such as aniline, n-butylamine, bis(4-aminophenyl)methane, and bis(4-methylaminophenyl)methane; triglycidyl isocyanurate; and N,N'-diglycidyl derivatives of cyclic alkylene ureas, such as ethyleneurea and 1,3-propyleneurea, and of hydantoins such as 5,5'-dimethylhydantoin. In general, however, they are not preferred.

Poly(S-glycidyl) compounds may also be used, e.g., di(S-glycidyl) derivatives of dithiols such as ethane-1,2-dithiol and bis(4-mercaptomethylphenyl) ether, but they also are not preferred.

Examples of epoxide resins having groups of formula XXV where R$^{12}$ and R$^{14}$ conjointly denote a —CH$_2$CH$_2$—group are bis(2,3-epoxycyclopentyl) ether, 2,3-epoxycyclopentyl glycidyl ether, and 1,2-bis(2,3-epoxycyclopentyloxy)ethane.

Epoxide resins having the 1,2-epoxide groups attached to different kinds of hetero atoms may be employed, e.g., the glycidyl ether-glycidyl ester of salicylic acid.

Epoxide resins in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0.$^{3,5}$]undec-9-yl glycidyl ether, 1,2-bis(4-oxatetracyclo [6.2.1.0$^{2,7}$.0.$^{3,5}$]undec-9-yloxy)ethane, 3,4-epoxycyclohexylmethyl 3',4'-epoxycyclohexanecarboxylate and its 6,6'-dimethyl derivative, ethylene glycol bis(3,4-epoxycyclohexanecarboxylate), 3-(3,4-epoxycyclohexyl)-8,9-epoxy-2,4-dioxaspiro[5,5]undecane, and epoxidised butadienes or copolymers of butadiene with ethylenic compounds such as styrene and vinyl acetate.

If desired, a mixture of epoxide resins may be used.

Especially preferred epoxide resins used in this invention are diglycidyl ethers, which may have been advanced, of dihydric phenols such as 2,2-bis(4-hydroxyphenyl)propane and bis(4-hydroxyphenyl)-methane and of dihydric aliphatic alcohols such as butane-1,4-diol.

If desired, the epoxide resin may be co-cured with a polyhydric alcohol, i.e., a compound having at least two alcoholic hydroxyl, preferably primary, groups per molecule. Preferably the polyhydric alcohol is present in a quantity sufficient to supply from 0.5 to 1.5, especially 0.75 to 1.25, alcoholic hydroxyl groups per 1,2-epoxide group of the epoxide resin. The polyhydric alcohol preferably contains, in addition to the alcoholic hydroxyl groups, only carbon, hydrogen, and, optionally, oxygen present as ether oxygen, acetal or carbonyl groups, and halogen atoms. It is further preferred that the polyhydric alcohol have a molecular weight of at least 100 and particularly more than 1000. Examples of suitable polyhydric alcohols are poly(oxyethylene) glycols, poly(oxypropylene)glycols, poly(oxytetramethylene) glycols, polyepichlorohydrins, poly(oxyethylene)-, poly(oxypropylene)-, and poly(oxytetramethylene) triols, obtainable by polymerisation of ethylene oxide, propylene oxide, or tetrahydrofuran in the presence of glycerol or 1,1,1-trimethylolpropane, hydroxyl-terminated polycaprolactones, copolymers of styrene with allyl alcohol, polyvinyl alcohols, hydroxypropylcellulose, hydroxyl-containing polyvinyl acetals, and partial esters of cellulose, e.g., a cellulose acetate butyrate.

Vinyl monomers and prepolymers which may be polymerised include styrene, α-methylstyrene, allylbenzene, divinylbenzene, vinylcyclohexane, 4-vinylcyclohex-1-ene, N-vinylpyrrolidin-2-one, N-vinylcarbazole, acrolein, isoprene, butadiene, piperylene, vinyl acetate, and vinyl ethers such as isobutyl vinyl ether, methyl vinyl ether, trimethylolpropane trivinyl ether, glycerol trivinyl ether, vinyl ethers of ethylene glycol and poly(oxyethylene glycols), and cyclic vinyl ethers having at least two cyclic vinyl ether groups each forming part of a 3,4-dihydro-2H-pyran nucleus, such as 3,4-dihydro-2H-pyran-2-ylmethyl 3,4-dihydro-2H-pyran-2-carboxylate and its prepolymers. The preferred vinyl compounds are vinyl ethers of aliphatic monohydric alcohols having 1 to 4 carbon atoms, and 3,4-dihydro-2H-pyran-2-ylmethyl 3,4-dihydro-2H-pyran-2-carboxylate and its prepolymers.

The aminoplasts preferred as component(a) contain, per molecule, at least two groups of formula $-CH_2OR^{15}$ directly attached to an amidic or thioamidic nitrogen atom or atoms, where $R^{15}$ denotes a hydrogen atom, an alkyl group of 1 to 4 carbon atoms, or an acetyl group. Examples of such aminoplasts are the N-hydroxymethyl, N-methoxymethyl, N-butoxymethyl, and N-acetoxymethyl derivatives of the following amides and amide-like substances. 1. Urea, thiourea, and the cyclic ureas having the formula

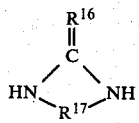

XXX in which
$R^{16}$ denotes oxygen or sulphur and
$R^{17}$ denotes either a group of formula

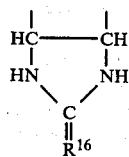

XXXI or a divalent group of 2 to 4 carbon atoms which may be substituted by methyl, methoxy, or hydroxy groups, and which may be interrupted by $-CO-$, $-O-$, or $-N(R^{18})-$, where $R^{18}$ denotes an alkyl or hydroxyalkyl group containing up to 4 carbon atoms.

Examples of such cyclic ureas are ethyleneurea (imidazolidin-2-one), dihydroxyethyleneurea (4,5-dihydroxyimidazolidin-2-one), hydantoin, uron (tetrahydro-oxadiazin-4-one), 1,2-propyleneurea (4-methylimidazolidin-2-one), 1,3-propyleneurea (hexahydro-2H-pyrimid-2-one), hydroxypropyleneurea (5-hydroxyhexahydro-2H-pyrimid-2-one), dimethylpropyleneurea (5,5-dimethylhexahydro-2H-pyrimid-2-one), dimethylhydroxypropyleneurea and dimethylmethoxypropyleneurea (4-hydroxy- and 4-methoxy-5,5-dimethylhexahydro-2H-pyrimid-2-one), 5-ethyltriazin-2-one, and 5-(2-hydroxyethyl)triazin-2-one. II. Carbamates and dicarbamates of aliphatic monohydric and dihydric alcohols containing up to four carbon atoms, e.g., methyl, ethyl, isopropyl, 2-hydroxyethyl, 2-methoxyethyl, 2-hydroxy-n-propyl and 3-hydroxy-n-propyl carbamates, and ethylene and 1,4-butylene dicarbamates. III. Melamine and other polyamino-1,3-triazines such as acetoguanamine, benzoguanamine, and adipoguanamine.

If desired, aminoplasts containing both N-hydroxymethyl and N-alkoxymethyl, or N-hydroxymethyl and N-acetoxymethyl, groups may be used (for example, a hexamethylolmelamine in which 1 to 3 of the hydroxyl groups have been etherified with methyl groups).

The preferred aminoplasts are condensation products of urea, uron, hydantoin, or melamine with formaldehyde, and partially or fully etherified products of such condensation products with an aliphatic monohydric alcohol of 1 to 4 carbon atoms. Specific examples of suitable aminoplasts are hexamethoxymethylmelamine and a condensation product of urea with 1.8 mol. of formaldehyde.

The preferred phenoplasts are resols made from a phenol and an aldehyde. Suitable phenols include phenol itself, resorcinol, 2,2-bis(p-hydroxyphenyl)propane, p-chlorophenol, a phenol substituted by one or two alkyl groups, each of 1 to 9 carbon atoms, such as o-, m-, and p-cresol, the xylenols, p-tertiary butylphenol, p-nonylphenol, and phenyl-substituted phenols, especially p-phenylphenol. The aldehyde which is condensed with the phenol is preferably formaldehyde, but other aldehydes such as acetaldehyde and furfuraldehyde may also be used. If desired, a mixture of such curable phenol-aldehyde resins may be used.

The preferred resols are condensation products of phenol, p-chlorophenol, resorcinol, or o-, m-, or p-cresol with formaldehyde.

Preferably the compositions of this invention also contain a sensitiser. It has been found that, by incorporation of suitable sensitisers, the speed of curing is yet further increased, thereby permitting the use of even shorter exposure times and/or of less powerful sources of irradiation. Further, the sensitivity to visible light is enhanced. Sensitisers other than dyes have been found the more effective, particularly aromatic polycyclic compounds having at least three fused benzene rings and having an ionisation energy of less than about 7.5 ev. Suitable such sensitisers are described in U.S. Pat. No. 4,069,054, and include anthracene, rubrene, perylene, phenanthrene, fluoranthene, and pyrene.

It is preferred to include from 0.1 to 2%, and especially from 0.25 to 0.75%, by weight of the sensitiser, calculated on the weight of (a).

In the photopolymerising step actinic radiation of wavelength from 200 to 600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual polymerisable substrate used, the type of light source, and its distance from the irradiated material. Suitable times may be readily determined by those familiar with photopolymerisation techniques. If, as in the process described below, it is necessary that the product so photopolymerised must still be curable on heating with a heat-curing agent admixed therewith, then, of course, irradiation is carried out at a temperature below that at which substantial heat-curing of the photopolymerised product by means of the heat-curing agent would occur.

The compositions of this invention may be used as surface coatings. They may be applied to a substrate such as steel, aluminium, copper, cadmium, zinc, paper, or wood, preferably as a liquid, and irradiated. By polymerising part of the coating, as by irradiation through a mask, those sections which have not been exposed may be washed with a solvent to remove the unpolymerised portions while leaving the photopolymerised, insoluble portions in place. Thus the compositions of this invention may be used in the production of printing plates and printed circuits. Methods of producing printing plates and printed circuits from photopolymerisable compositions are well known (see, e.g., British Pat. No. 1 495 746).

The compositions may also be used as adhesives. A layer of the composition may be sandwiched between two surfaces of objects, at least one of which is transparent to the actinic radiation, e.g., of glass, then the assembly is irradiated and, if desired, heated to complete the polymerisation.

The compositions are also useful in the production of fibre-reinforced composites, including sheet moulding compounds.

They may be applied directly, in liquid form, to reinforcing fibres (including strands, filaments, and whiskers), which may be in the form of woven or nonwoven cloth, unidirectional lengths, or chopped strands, especially glass, boron, stainless steel, tungsten, alumina, silicon carbide, asbestos, potassium titanate whiskers, an aromatic polyamide such as poly(m-phenylene isophthalamide), poly(p-phenylene terephthalamide), or poly(p-benzamide), polyethylene, polypropylene, or carbon.

The fibre-reinforced composite may be made by a batch process, the fibrous reinforcing material being laid on a film of the photopolymerised composition, which is advantageously under slight tension, when a second such film may, if desired, be laid on top, and the assembly is pressed while being heated. It may also be made continuously, such as by contacting the fibrous reinforcing material with a film of the photopolymerised composition, then, if desired, placing a second such film on the reverse face of the fibrous reinforcing material and applying heat and pressure. More conveniently, two such films, preferably supported on the reverse side by belts or strippable sheets, are applied simultaneously to the fibrous reinforcing material so as to contact each exposed face. When two such films are applied, they may be the same or different.

Multilayer composites may be made by heating under pressure interleaved films and layers of one or more fibrous reinforcing materials. When unidirectional fibres are used as the reinforcement material, successive layers of them may be oriented to form cross-ply structures.

With the fibrous reinforcing material there may be used additional types of reinforcement such as a foil of metal (e.g., aluminium, steel, or titanium) or a sheet of a plastics material (e.g., an aromatic or aliphatic polyamide, a polyimide, a polysulphone, or a polycarbonate) or of a rubber (e.g., a neoprene or acrylonitrile rubber).

In the production of sheet moulding compounds, a composition of this invention, together with the chopped strand reinforcing material and any other components, are exposed to irradiation in layers through supporting sheets.

The polymerisable composition is preferably applied so that the composite contains a total of from 20 to 80% by weight of the said composition and, correspondingly, 80 to 20% by weight of the reinforcement. More preferably, a total of 30 to 50% by weight of the composition is employed.

The compositions of this invention are useful in the production of putties and fillers. They may be used as dip-coatings, an article to be coated being dipped in the liquid composition, withdrawn, and the adhering coating being irradiated to photopolymerise, and hence solidify it, and subsequently, if desired, being heated.

It has been found that it is possible, using the compositions of this invention, to cure epoxide resins and phenoplasts in two stages; the resin is first converted into the partially cured B-stage by exposing it to actinic radiation in the presence of a sulphoxonium salt and a latent, heat-activated crosslinking agent for the epoxide resin or phenoplast, and, in a second stage, the partially cured composition is heated so that curing is completed by means of the heat-activated crosslinking agent. Thus, a liquid or semiliquid composition may be prepared, which may then be shaped or used to impregnate a substrate while being irradiated to solidify it; then the solidified body is heated when desired, to complete the cure of the resin.

According, therefore, to another embodiment of this invention, an epoxide resin or a phenoplast is irradiated, in the presence of an amount of a sulphoxonium salt of formula VI effective for the polymerisation of the epoxide resin or phenoplast and of a curing amount of a latent heat-curing agent for the epoxide resin or phenoplast, to form a B-stage product and, when desired, curing of the composition is completed by heating it.

A further embodiment comprises a composition containing an epoxide resin or phenoplast, an amount of a sulphoxonium salt of formula VI effective for polymerisation of the said epoxide resin or phenoplast on exposure of the composition to actinic radiation, and a curing amount of a latent heat-curing agent for the epoxide resin or phenoplast.

Suitable heat-activated crosslinking agents for the epoxide resin compositions include polycarboxylic acid anhydrides, complexes of amines, especially primary or tertiary aliphatic amines such as ethylamine, trimethylamine, and n-octyldimethylamine, with boron trifluoride or boron trichloride, and latent boron difluoride chelates. Aromatic polyamines and imidazoles are usually not preferred, because indifferent results are obtained, possibly due to reaction between the acid catalyst liberated and the amine. Dicyandiamide can be used successfully, providing it is in relatively coarse particles.

Suitable heat-activated corsslinking agents for resols include hexamethylenetetramine and paraform.

The temperature and duration of heating required for the thermal curing and the proportions of heat-activated curing agent are readily found by routine experimentation and easily derivable from what is already well known concerning the heat-curing of epoxide resins and phenol-aldehyde resols.

By virtue of the compositions having groups through which they can be heat-cured after photopolymerisation, they are particularly useful in the production of multilayer printed circuits.

Conventionally, a multilayer printed circuit is prepared from several double-sided printed circuit boards of copper, stacked one on top of another and separated from each other by insulating sheets, usually of glass fibre impregnated with an epoxide resin or a phenol-formaldehyde resin in the B-stage. If a heat-curing agent is not admixed with the layer of photopolymerisable resin in the circuit board, it can be incorporated in the insulating layers which alternate with the plates, these layers conveniently being of an epoxide resin or phenol-formaldehyde resin prepreg; sufficient of the heat-curing agent contained in the prepreg, providing the latter is not too thick, migrates to induce crosslinking of the photopolymerised epoxide resin or phenol-formaldehyde resin. The stack is heated and compressed to bond the layers together. Conventional photopolymerisable materials, however, do not form strong bonds either with copper or with resin-impregnated glass fibre sheets. A stack which is bonded with the photopolymer still covering the copper is therefore inherently weak and in use can become delaminated. It is therefore normal practice to remove the residual photopolymer after the etching stage, either by means of powerful solvents or by a mechanical method, e.g., by means of brushes. Such a stripping process can damage the copper of the printed circuit or the surface of the laminate on which the circuit rests, and so there is a need for a method which would avoid the necessity of removing the photopolymerised material prior to bonding the boards together. The presence of residual crosslinking groups in the compositions of this invention means that crosslinking can occur when the boards are bonded, resulting in good adhesion to the copper and to the resin-impregnated glass fibre substrate, so avoiding the necessity just referred to.

Another application involving heat-curing after photopolymerisation of the compositions of this invention is in filament winding. Thus, a continuous tow of fibrous reinforcement is impregnated with a composition containing a latent heat-curing agent and then wound around a mandrel or former while exposing the winding to actinic radiation. Such filament windings still have a degree of flexibility, permitting the mandrel or former to be removed more readily than when a rigid winding is formed in one step. When required, the winding is heated to crosslink the composition.

In a further such application, a layer of the composition in liquid form is irradiated until it soldifies, producing a film adhesive, which is then placed between, and in contact with, two surfaces which are to be bonded together, and the assembly is heated to complete crosslinking of the composition. The film may be provided on one face with a strippable backing sheet, e.g., of a polyolefin or a polyester, or of cellulosic paper having a coating of a silicone release agent. Manipulation of the assembly is often easier if the film has a tacky surface. This may be produced by coating the film with a substance which is tacky at room temperature but which crosslinks to a hard, insoluble, infusible, resin under the conditions of heat employed to complete crosslinking of the composition. However, an adequate degree of tackiness often exists without additional treatment, especially if polymerisation of the composition has not proceeded too far. Suitable adherends include metals such as iron, zinc, cadmium, copper, nickel, and aluminium, ceramics, glass, and rubbers.

The following Examples illustrate the invention. Unless otherwise indicated, parts are by weight. Flexural strengths are the mean of three results and were determined according to British Standard No. 2782, Method 304B.

Sulphoxonium salts employed in these Examples were prepared as follows.

Dimethylphenylsulphoxonium hexafluorophosphate

This was prepared by S-methylation of methyl phenyl sulphoxide in the presence of mercury (II) iodide as catalyst (M. Kobayashi et al., *Bull. Chem. Soc. Japan*, 1972, 45, 3703; K. Kamiyama et al., ibid., 1973, 46, 2255) and conversion of the dimethylphenylsulphoxonium mercuritri-iodide into the hexafluorophosphate either directly or via the perchlorate, made as described by K. Ryoke et al., ibid., 1976, 49, 1455.

Thus, a mixture of iodomethane (200 parts), methyl phenyl sulphoxide (20 parts), and mercury (II) iodide (21.7 parts) was heated to reflux under nitrogen for 60 hours. The excess of iodomethane was distilled off under vacuum and unchanged methyl phenyl sulphoxide was removed by extracting it into diethyl ether. Recrystallisation from methanol of the pale yellow powder remaining afforded 12 parts of dimethylphenylsulphoxonium mercuritri-iodide, melting at 137°–9° C., NMR spectrum (acetone-$d_6$), 4.40 (S—6H), 8.22 (m—5H).

The mercuritri-iodide (11 parts) was dissolved in 100 parts of acetone, and a solution in acetone of 5 parts of silver hexafluorophosphate was added dropwise. After the mixture had been stirred for 15 minutes, the precipitated mercury (II) iodide and silver iodide were filtered off and the filtrate was evaporated to leave the required hexafluorophosphate (VI, $R^7$=H, $R^6$=$C_6H_4$, p=zero, $R^8$=$R^9$=$CH_3$, R=1, $Z^{r-}$=$PF_6^-$) as a pale yellow powder. On recrystallization from methanol it comprised colourless needles, m.p. 176°–80° C., NMR spectrum (acetone-$d_6$) 4.35 (S—6H), 8.18 (m—5H). The required hexafluorophosphate was also produced by conversion of the mercuritri-iodide into dimethylphenylsulphoxonium perchlorate by treatment with a solution of silver perchlorate in acetone (as described above for the reaction with silver hexafluorophosphate), followed by treatment of an aqueous solution of the perchlorate with potassium hexafluorophosphate.

Dimethylphenacylsulphoxonium chloride

Under an atmosphere of nitrogen, benzoyl chloride (11.4 parts) was added dropwise over 10 minutes to 300 parts of a 0.4 M solution of dimethylsulphoxonium methylide in tetrahydrofuran. The resulting mixture was stirred for 1.5 hours, and then hydrogen chloride gas was bubbled through the solution until no more precipitate appeared. After filtering off the precipitate and drying it under vacuum there remained 27.5 parts of a white powder consisting of dimethylphenacylsulphoxonium chloride (VI, $R^7$=H, $R^6$=$C_6H_4$, p=1, $R^8$=$R^9$=$CH_3$, $R^{10}$=$R^{11}$=H, r=1, $Z^{r-}$=$Cl^-$) admixed with trimethylsulphoxonium chloride.

Dimethylphenacylsulphoxonium hexafluorophosphate

A further sample (27.5 parts) of the mixture of dimethylphenacylsulphoxonium chloride and trimethylsulphoxonium chloride obtained as described in the preceding paragraph was dissolved in 150 parts of water, and thereto was added with stirring a solution of 40 parts of potassium hexafluorophosphate in 150 parts of water. After 30 minutes the precipitated solid was filtered off, washed with water, and dried under vacuum at 50°–60° C.

A sample (6 parts) of the dried solid was extracted with 20 parts of acetone. Evaporation of the acetone left 4 parts of the desired dimethylphenacylsulphoxonium hexafluorophosphate (VI, $R^7$=H, $R^6$=$C_6H_4$, $p=1$, $R^8=R^9=CH_3$, $R^{10}=R^{11}=H$, $r=1$, $Z^{r-}=PF_6^-$), essentially free of the trimethylsulphoxonium salt, as a pale yellow solid, m.pt. 161°-3° C. On recrystallisation from methanol, colourless plates, m.pt. 171° C., were obtained. NMR (acetone —d$_6$) 4.15 (s—6H) 6.10 (s—2H), 7.95 (m—5H): I.R. (KBr disc) 3020, 2690, 2920, 1675, 1590, 1330, 1310, 1230, 1190, 1035, 980, and 840 cm$^{-1}$: U.V. (ethanol) $\lambda_{max}=254$ nm.

Dimethylphenacylsulphoxonium hexafluorophosphate was also prepared by adding 11.4 parts of benzoyl chloride dropwise over 10 minutes to 300 parts of a 0.4 M solution of dimethylsulphoxonium methylide in tetrahydrofuran under nitrogen and stirring for 1½ hours as before, then adding dropwise over 20 minutes 45 parts of hexafluorophosphoric acid-diethyl ether complex, stirring for a further 1½ hours, filtering off the precipitate and drying it in a vacuum (47 parts of a mixture of trimethylsulphoxonium hexafluorophosphate and dimethylphenacylsulphoxonium hexafluorophosphate being obtained), and then extracting the desired phenacyl compound into acetone as before.

(Diethylamino)diphenylsulphoxonium hexafluorophosphate

S,S-Diphenylsulphoximine was prepared by the reaction of diphenyl sulphoxide, sodium azide, and sulphuric acid in chloroform, according to the method described by S. Oae et al., *Int. J. Sulfur chem.*, Part A, 1972, 2 (1), 49. Treatment of this sulphoximine with triethyloxonium hexafluorophosphate, in the manner described by C. R. Johnson et al., *J. Amer. Chem. Soc.*, 1973, 95, 7692, for the reaction of S-ethyl-S-p-tolylsulphoximine with trimethyloxonium tetrafluoroborate, yielded the previously unknown (diethylamino)diphenylsulphoxonium hexafluorophosphate (VI, $R^7=H$, $R^6=C_6H_4$, p=zero, $R^8=(C_2H_5)_2N$, $R^9=C_6H_5$, $r=1$, $Z^{r-}=PF_6^-$) in 68% yield after recrystallisation from a mixture of dichloromethane and diethyl ether. The product had a m.pt. 148°-50° C., NMR (CDCl$_3$) 7.7-8.3 (m—10H), 3.50 (q—4H), 1.33 (t—6H).

1,4-Bis(1-oxo-2-(dimethylsulphoxonium)ethyl)benzene dihexafluoroarsenate

Under an atmosphere of nitrogen, terephthaloyl chloride (8.5 parts) dissolved in 18 parts of tetrahydrofuran was added dropwise over 30 minutes to 300 parts of a 0.4 M solution of dimethylsulphoxonium methylide in tetrahydrofuran. After the mixture had been stirred for 1.5 hours, hydrogen chloride gas was bubbled through until no more precipitate was formed. The mixture was then stirred for a further hour, and the solid was filtered off and dried under vacuum.

A sample of this solid (5 parts) was stirred with 50 parts of water, and a solution of potassium hexafluoroarsenate (15 parts) in 100 parts of water was added. After the mixture had been stirred for 30 minutes, the solid was filtered off, and then recrystallised several times from methanol. There was thereby obtained, substantially free from trimethylsulphoxonium hexafluoroarsenate, the desired product (VI, $R^7$=p-COCH$_2$S$^+$(CH$_3$)$_2$=O, AsF$_6^-$, $R^6=C_6H_4$, $p=1$, $R^8=R^9=CH_3$, $R^{10}=R^{11}=H$, $r=1$, $Z^{r-}=AsF_6^-$) as pale yellow crystals, m.pt. 188°-90° C., NMR (acetone-d$_6$) 4.20 (s—12H), 6.30 (s—4H), 8.32 (s—4H); I.R. (KBr disc) 3020, 2930, 1685, 1405, 1310, 1235, 1035, 980, 950, and 700 cm$^{-1}$; UV (ethanol) $\lambda_{max}=311$ nm.

Diphenylphenacylsulphoxonium hexafluorophosphate

Diphenylsulphoxonium phenacylide was prepared by the reaction of α-diazoacetophenone with diphenyl sulphoxide in the presence of copper acetylacetonate as described by Takebayashi et al. (Chemistry Letters, 1973, 809). Hydrogen chloride gas was passed through a solution of this ylide in toluene until no more precipitate was formed. This precipitate was filtered off, dried under vacuum, and then dissolved in water. An equimolar amount of an aqueous solution of potassium hexafluorophosphate was added and, after stirring for 15 minutes, the precipitated diphenylphenacylsulphoxonium hexafluorophosphate (V1, $R^7=H$, $R^6=C_6H_4$, $p=1$, $R^8=R^9=C_6H_5$, $R^{10}=R^{11}=H$, $r=1$, $Z^{r-}=PF_6^-$) was separated off and dried under vacuum.

1,4-Bis(1-oxo-2-(dimethylsulphoxonium)ethyl)benzene dihexafluoroantimonate

A further sample (5 parts) of the mixture of 1,4-bis(1-oxo-2-(dimethylsulphoxonium)ethyl)benzene dichloride and trimethylsulphoxonium chloride, prepared as described above, was stirred with 100 parts of water and to this suspension was added in portions 18 parts of potassium hexafluoroantimonate. After stirring for a further 30 minutes, the mixture of 1,4-bis(1-oxo-2-(dimethylsulphoxonium)ethyl)benzene dihexafluoroantimonate (V1, $R^7$=p-COCH$_2$S$^+$(CH$_3$)$_2$=O.AsF$_6^-$, $R^6=C_6H_4$, $p=1$, $R^8=R^9=CH_3$, $R^{10}=R^{11}=H$, $r=1$, $Z^{r-}=SbF_6^-$) and trimethylsulphoxonium hexafluoroantimonate so obtained was filtered off and dried under vacuum.

Dodecylmethylbenzylsulphoxonium hexafluorophosphate

Dodecylmethylbenzylsulphoxonium methosulphate was prepared as described in U.S. Pat. No. 3,196,184. To a solution of this salt in water was added an equivalent amount of potassium hexafluorophosphate in water. An oil separated, which was isolated and dried, and shown by infra-red spectroscopy to be the desired hexafluorophosphate (V1, $R^7=H$, $R^6=C_6H_4CH_2$, p=zero, $R^8=C_{12}H_{25}$, $R^9=CH_3$, $r=1$, $Z^{r-}=PF_6^-$).

Dimethylphenacylsulphoxonium hexafluoroantimonate

A further sample (5 parts) of the mixture of dimethylphenacylsulphoxonium chloride and trimethylsulphoxonium chloride was dissolved in 50 parts of water and thereto was added with stirring 6.7 parts of sodium hexafluoroantimonate. After 30 minutes the precipitated solid was filtered off, washed with water, and dried under vacuum. There was thus obtained 8 parts of a mixture of dimethylphenacylsulphoxonium hexafluoroantimonate (V1, $R^7=H$, $R^6=C_6H_4$, $p=1$, $R^8=R^9=CH_3$, $R^{10}=R^{11}=H$, $r=1$, $Z^{r-}=SbF_6^-$) and trimethylsulphoxonium hexafluoroantimonate.

Triphenylsulphoxonium hexafluorophosphate

A mixture consisting of 157 parts of acetone, 4 parts of triphenylsulphonium hexafluorophosphate, 8.48 parts of sodium carbonate, and 17.2 parts of m-chloroperoxybenzoic acid was stirred at 20° C. for 24 hours. A solution of 40 parts of sodium thiosulphate in 500 parts of water was added. The acetone was removed under reduced pressure and triphenylsulphoxonium hexafluorophosphate was filtered off and dried under vacuum at 50° C. The desired product thus obtained (V1, $R^7$=H, $R^6$=C$_6$H$_4$, p=zero, $R^8$=$R^9$=C$_6$H$_5$, r=1, $Z^{r-}$=PF$_6^-$), had m.pt. 233°–238° C., NMR (acetone-d$_6$) 7.8–8.3 (m); I.R. (KBr disc) 3100, 3070, 1450, 1225, 1080, 840, 760, 730, 685 cm$^{-1}$; UV (ethanol) $\lambda_{max}$ 232 nm and 270 nm.

Tris(dimethylphenacylsulphoxonium) phosphate

To a solution of trimethylphoxonium iodide (14.3 parts) in dimethyl sulphoxide (360 parts) under nitrogen was added 1.95 parts of sodium hydride. The mixture was stirred, and when the evolution of hydrogen had ceased a solution of benzoic anhydride (7.6 parts) in toluene (20 parts) was added. After the mixture had been stirred for a further hour the solid, trimethylsulphoxonium benzoate, was filtered off and the solvent was distilled off from the filtrate under reduced pressure. The residue from the filtrate was extracted four times into hot toluene (each with 50 parts of toluene), and then hydrogen chloride gas was passed for several minutes into the combined toluene extracts. The toluene was decanted off and the solid remaining was washed with ether.

A portion (5.0 parts) of this solid (i.e., dimethylphenacyl sulphoxonium chloride) was dissolved in water (50 parts) and to the solution was added 2.97 parts of silver phosphate. After the mixture had been stirred for 1 hour the precipitated silver chloride was filtered off and the desired trisulphoxonium orthophosphate (V1, $R^7$=H, $R^6$=C$_6$H$_5$, p=1, $R^8$=$R^9$=CH$_3$, $R^{10}$=$R^{11}$=H, r=3, $Z^{r-}$=PO$_4^{3-}$) was recovered by distilling off the water.

EXAMPLES 1-6

Compositions of epoxide resins and sulphoxonium salts were prepared as listed in the following Table and drawn as films 10 μm thick on tinplate, then subjected at a distance of 8 cm to radiation from a medium pressure mercury arc lamp (80 w per cm) for 5 seconds or, in the case of Example 3, for 30 seconds and in Example 5 for 60 seconds. In each case a hard, clear film was formed.

| Example No. | Epoxide Resin Name | Parts | Sulphoxonium Salt Name | Parts |
| --- | --- | --- | --- | --- |
| 1 | 2,2-Bis(p-glycidyl-oxyphenyl)propane | 98 | Dimethylphenyl-sulphoxonium hexafluoro-phosphate | 2 |
| 2 | 2,2-Bis(p-glycidyl-oxyphenyl)propane | 98 | Dimethyl-phenacylsulphox-onium hexa-fluorophosphate | 2 |
| 3 | 2,2-Bis(p-glycidyl-oxyphenyl)propane | 98 | (Diethylamino)-diphenyl-sulphoxonium hexafluoro-phosphate | 2 |
| 4 | 2,2-Bis(p-glycidyl-oxyphenyl)propane | 99 | 1,4-Bis(1-oxo-2-(dimethyl-sulphoxonium)-ethyl)benzene dihexafluoro-arsenate | 1 |
| 5 | 2,2-Bis(p-glycidyl-oxyphenyl)propane | 99 | Diphenyl-phenacylsul-phoxonium hexa-fluorophosphate | 1 |
| 6 | 3,4-epoxycyclohexyl-methyl 3,4-epoxycyclohex-anecarboxylate | 98 | Dimethyl-phenacylsul-phoxonium hexa-fluorophosphate | 2 |

EXAMPLE 7

A mixture of 2 parts of dimethylphenacylsulphoxonium hexafluorophosphate and 98 parts of 3,4-dihydro-2H-pyran-2-ylmethyl 3,4-dihydro-2H-pyran-2-carboxylate was irradiated as a film 10 μm thick on tinplate for 5 seconds as described in Examples 1-6. A tack-free coating was produced.

EXAMPLE 8

The procedure of Example 7 was repeated, using in place of the vinyl ether a commercially-available phenol-formaldehyde resol having a P:F molar ratio of 1:1.6. A hard, tack-free coating was obtained after irradiation for 5 seconds.

EXAMPLE 9

The procedure of Example 7 was repeated, but with 4 parts of a mixture of dimethylphenacylsulphoxonium chloride and trimethylsulphoxonium chloride, and using in place of the vinyl ether 96 parts of a commercially-available urea-formaldehyde resin (resin-forming solids content 70%; U:F molar ratio of 1:1.8). A tack-free, solvent-resistant coating was obtained on irradiation for 5 seconds.

EXAMPLE 10

The procedure of Example 9 was repeated, using as the catalyst 4 parts of tris(dimethylphenacylsulphoxonium) phosphate. A tack-free coating was likewise obtained on irradiation for 5 seconds.

EXAMPLE 11

The procedure of Example 7 was repeated, using in place of the vinyl ether a commercially-available methylated melamineformaldehyde resin (substantially hexa(methoxymethyl)melamine). After the film had been irradiated for 5 seconds, curing was completed by heating for 15 minutes at 120° C. A hard, solvent-resistant coating was obtained.

EXAMPLE 12

A portion of the composition prepared in Example 4 was applied as a layer 10 μm thick on a glass plate 1 mm thick, a similar glass plate was placed on top, and the assembly was irradiated with an 80 w per cm medium pressure mercury arc lamp. After exposure for 30 seconds the glass plates were permanently bonded together.

EXAMPLE 13

One part of the mixture of 1,4-bis(1-oxo-2-(dimethylsulphoxonium)ethyl)benzene dihexafluoroantimonate and trimethylsulphoxonium hexafluoroantimonate, prepared as described above, was mixed with 99 parts of 2,2-bis(p-glycidyloxyphenyl)propane, and this composition was irradiated, as a layer 10 μm thick on tinplate, for 10 seconds as described in Examples 1-6. A hard, tack-free coating was obtained.

EXAMPLE 14

Dodecylmethylbenzylsulphoxonium hexafluorophosphate (2 parts) was mixed with 98 parts of 2,2-bis(p-glycidyloxyphenyl)propane, and a layer of this mixture, 10 μm thick, on tinplate was irradiated as described in Examples 1-6 for 30 seconds. A tack-free coating was obtained.

EXAMPLE 15

Two parts of the mixture of dimethylphenacylsulphoxonium hexafluoroantimonate and trimethylsulphoxonium hexafluoroantimonate was mixed with 98 parts of 2,2-bis(p-glycidyloxyphenyl)propane, and this composition was irradiated as in Examples 1–6. A tack-free coating was obtained within 10 seconds.

EXAMPLE 16

A mixture of 2,2-bis(p-glycidyloxyphenyl)propane (10 parts), γ-butyrolactone (0.2 part), and triphenylsulphoxonium hexafluorophosphate (0.1 part) was applied to tinplate and irradiated as described in Examples 1 to 6 for 12 seconds. A clear, hard, tack-free coating was thus obtained.

EXAMPLE 17

The procedure of Example 16 was repeated, using 3,4-epoxycyclohexylmethyl 3,4-epoxycyclohexanecarboxylate as the epoxide resin and 0.2 part of triphenylsulphoxonium hexafluorophosphate. A clear, hard, tack-free coating was obtained on irradiation for 4 seconds.

EXAMPLE 18

This Example illustrates co-curing with a polyhydric alcohol.

A composition comprising 100 parts of 3,4-epoxycyclohexylmethyl 3,4-epoxycyclohexanecarboxylate, 75 parts of a commercially-available styrene-allyl alcohol copolymer (hydroxy content 3.56 equiv./kg), and 1.5 parts of 1,4-bis(1-oxo-2-(dimethylsulphoxonium)ethyl)-benzene dihexafluoroarsenate was applied as a coating 10 μm thick on tinplate, and then exposed to irradiation from a medium pressure mercury arc lamp. A solvent-resistant coating was formed in 10 seconds.

EXAMPLE 19

This Example demonstrates a two-stage process, in which an epoxide resin composition is first photopolymerised and then, on heating, is crosslinked by the latent heat-curing catalyst also contained in the composition.

A liquid composition comprising 75 parts of a diglycidyl ether of 2,2-bis(p-hydroxyphenyl)propane (epoxide content 5.1 equiv./kg), 25 parts of a polyglycidyl ether (epoxide content 5.6 equiv./kg) of a phenol-formaldehyde novolak, 4 parts of boron trichloride-trimethylamine complex, and 2 parts of dimethylphenacylsulphoxonium hexafluorophosphate was used to impregnate glasscloth and the impregnated cloth was exposed on both sides to irradiation from an 80 w per cm medium pressure arc lamp at a distance of 8 cm for 10 seconds. A six-ply laminate was made by pressing 10 cm-square pieces of the prepreg at 200° C. for 1 hour at a pressure of 1.05 MN/m². This laminate, which consisted of 62% of glass, had a flexural strength of 406 MN/m².

EXAMPLE 20

This Example illustrates the use of a sensitiser.

A portion of a composition comprising 2 parts of 1,4-bis(1-oxo-2-(dimethylsulphoxonium)ethyl)benzene dihexafluoroarsenate and 98 parts of 2,2-bis(p-glycidyloxyphenyl)propane was applied as a 10 μm film to tinplate. The layer was exposed to irradiation from a 400 w high pressure metal halide-quartz lamp at a distance of 22 cm. After 2½ minutes' exposure, a tack-free film was produced. To another portion of the above mixture was added 0.6% of pyrene. Exposure of this mixture as a 10 μm film to the same irradiation conditions as the mixture without pyrene produced a tack-free coating after 1¼ minutes' irradiation. This film could not be removed with acetone.

EXAMPLE 21

This Example illustrates the production of a photoresist.

A solution of 1 g of the diglycidyl ether of 2,2-bis(4-hydroxyphenyl)propane, 4 g of the tetraglycidyl ether of 1,1,2,2-tetra(4-hydroxyphenyl)ethane, 5 g of a diglycidyl ether of 2,2-bis(4-hydroxyphenyl)propane which had been advanced with a bromine-containing phenol to a softening point of 50° C. and had an epoxide content of 2 equiv./kg, and 0.2 g of dimethylphenacylsulphoxonium hexafluorophosphate in 10 g of cyclohexanone was prepared. A copper-clad laminate was coated with this composition and the solvent was allowed to evaporate, leaving a film about 10 μm thick. This film was irradiated for 10 minutes through a negative using a 500 w medium pressure mercury lamp at a distance of 22 cm. After irradiation, the image was developed in toluene, washing away the unexposed areas to leave a good relief image on the copper. The uncoated areas were then etched using an aqueous solution of ferric chloride (41% w/w $FeCl_3$) at 35° C., leaving the coated areas intact.

What is claimed is:

1. Compositions comprising
   (a) a compound, or mixture of compounds, capable of being transformed into a higher-molecular weight material under the influence of a cationic catalyst,
   (b) an effective amount of a sulfoxonium salt of the formula

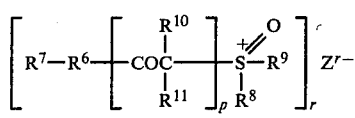

VI where p denotes zero or 1, $R^6$ denotes an arylene or aralkylene group of 4 to 25 carbon atoms linked directly through a carbon atom thereof to, if p denotes zero, the indicated sulfur atom or, if p denotes 1, to the indicated carbonyl carbon atom, $R^7$ denotes a hydrogen atom, or a group of formula

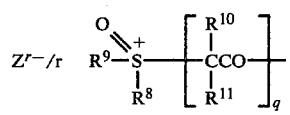

VII $R^8$ denotes an alkyl group of 1 to 18 carbon atoms, an alkenyl group of 2 to 6 carbon atoms, a cycloalkyl group of 3 to 6 carbon atoms, a cycloalkylalkyl group of 4 to 8 carbon atoms, an aryl group of 4 to 24 carbon atoms, or an aralkyl group of 5 to 16 carbon atoms, $R^9$ has the same meaning as $R^8$ but may alternatively represent a dialkylamino group of 2 to 6 carbon atoms or, if $R^8$ denotes a said alkyl group, an arylamino group of 4 to 8 carbon atoms, $R^{10}$ and $R^{11}$ each independently have the same meaning as $R^8$ but may also each represent a hydrogen atom, r represents 1, 2, or 3, $Z^{r-}$ denotes an r-valent anion of a protic acid, and q denotes zero when p denotes zero, or zero or 1 when p denotes 1.

2. A composition according to claim 1, wherein $R^6$ denotes a homocyclic arylene or aralkylene group of 6 to 11 carbon atoms.

3. A composition according to claim 1, wherein $R^8$ and $R^9$ each denote an alkyl group of 1 to 12 carbon atoms.

4. A composition according to claim 1, wherein $R^8$ and $R^9$ each denote an alkyl group of 1 to 4 carbon atoms, or a phenyl or naphthyl group, which may be substituted in the ring or rings by one or two alkyl groups, each of 1 to 4 carbon atoms, by one or two alkoxy groups, each of 1 to 4 carbon atoms, or by one or two fluorine, chlorine, or bromine atoms.

5. A composition according to claim 1, where $Z^{r-}$ denotes $Cl^-$, $Br^-$, $NO_3^-$, $HSO_4^-$, $ClO_4^-$, $H_2PO_4^-$, $SO_4^{--}$, $PO_4^{---}$, or an anion of formula $$MX_n^- \qquad \qquad \text{IX}$$

where

M denotes an atom of boron, bismuth, antimony, arsenic, or phosphorus,

X denotes an atom of fluorine or chlorine, and n is 4, 5, or 6 and is one more than the valency of M.

6. A composition according to claim 1, wherein (b) is dimethylphenylsulfoxonium hexafluorophosphate, dimethylphenacylsulfoxonium hexafluorophosphate, dimethylphenacylsulfoxonium hexafluoroantimonate, diphenylphenacylsulfoxonium hexafluorophosphate, 1,4-bis(1-oxo-2-(dimethylsulfoxonium)ethyl)benzene dihexafluoroarsenate, (dimethylamino)diphenylsulfoxonium tetrafluoroborate, (diethylamino)diphenylsulfoxonium hexafluorophosphate, 1,4-bis(1-oxo-2-(dimethylsulfoxonium)ethyl)benzene dihexafluoroantimonate, dodecylmethylbenzylsulfoxonium hexafluorophosphate, triphenylsulfoxonium hexafluorophosphate, dimethylphenylsulfoxonium, perchlorate, dimethylphenacylsulfoxonium chloride, 1,4-bis(1-oxo-2-(dimethylsulfoxonium)ethyl)benzene dichloride, or tris(dimethylphenacylsulfoxonium) phosphate.

7. A composition according to claim 1, wherein (a) is a 1,2-epoxide, a vinyl monomer or prepolymer, an aminoplast, or a phenoplast.

8. A composition according to claim 7, wherein (a) is an epoxide resin, or a resol resin made from a phenol and an aldehyde.

9. A composition according to claim 1, containing 0.1 to 7.5 parts by weight of (b) per 100 parts by weight of (a).

10. A composition according to claim 8, which also contains a curing amount of a latent heat-curing agent for the epoxide resin or for the resol resin.

* * * * *